(12) United States Patent
Joo

(10) Patent No.: US 8,873,315 B2
(45) Date of Patent: Oct. 28, 2014

(54) SEMICONDUCTOR MEMORY DEVICE AND METHOD OF OPERATING THE SAME

(75) Inventor: Byoung In Joo, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 238 days.

(21) Appl. No.: 13/615,951

(22) Filed: Sep. 14, 2012

(65) Prior Publication Data

US 2014/0010008 A1 Jan. 9, 2014

(30) Foreign Application Priority Data

Jul. 6, 2012 (KR) ........................ 10-2012-0073970

(51) Int. Cl.
*G11C 16/06* (2006.01)
(52) U.S. Cl.
USPC ............. 365/189.15; 365/189.16; 365/185.18
(58) Field of Classification Search
CPC ........ G11C 16/06; G11C 16/26; G11C 16/34; G11C 16/3436
USPC ............... 365/185.2, 185.18, 185.03, 185.09, 365/189.15, 189.16, 189.05
See application file for complete search history.

(56) References Cited

U.S. PATENT DOCUMENTS

| | | | |
|---|---|---|---|
| 6,331,948 B2 * | 12/2001 | Kasai et al. ............... | 365/185.09 |
| 8,719,665 B2 * | 5/2014 | Roohparvar et al. ......... | 714/768 |
| 8,750,042 B2 * | 6/2014 | Sharon et al. ............. | 365/185.09 |
| 2002/0036925 A1 * | 3/2002 | Tanzawa et al. .......... | 365/185.22 |
| 2008/0137416 A1 * | 6/2008 | Lee .......................... | 365/185.03 |
| 2011/0063918 A1 * | 3/2011 | Pei et al. ................... | 365/185.18 |

\* cited by examiner

*Primary Examiner* — Douglas King
(74) *Attorney, Agent, or Firm* — William Park & Associates Patent Ltd.

(57) ABSTRACT

The present disclosure relates to a semiconductor memory device and a method of operation the semiconductor memory device, which sets an encoding value by sequentially defining ranges used for recognizing distribution of memory cells based on a middle range and then performing a read operation in an order from the middle ranges to an outermost range, thereby capable of using infinite ranges for recognizing the distribution of the memory cells without addition of a circuit to an inside of the semiconductor memory device.

20 Claims, 6 Drawing Sheets

FIG. 6

|    | A | B | C | D | E | F | G | H |            |
|----|---|---|---|---|---|---|---|---|------------|
| R4 | 1 | 1 | 1 | 1 | 0 | 0 | 0 | 0 | → 1st En-Coding Data |
| R2 | 1 | 1 | 0 | 0 | 0 | 0 | 0→1 | 0→1 |        |
| R6 | 1 | 1 | 0 | 0 | 0 | 0 | 0→1 | 0→1 | → 2nd En-Coding Data |
| R1 | 1 | 0 | 0 | 0→1 | 0→1 | 0→1→0 | 0→1→0 | 0→1→0→1 |  |
| R3 | 1 | 0 | 0 | 1 | 1 | 0 | 0 | 0 |              |
| R5 | 1 | 0 | 0 | 1 | 1 | 0 | 0 | 0 |              |
| R7 | 1 | 0 | 0 | 1 | 1 | 0 | 0 | 1 | → 3rd En-Coding Data |

R1  R2  R3  R4  R5  R6  R7

SEMICONDUCTOR MEMORY DEVICE AND METHOD OF OPERATING THE SAME

CROSS-REFERENCE TO RELATED APPLICATIONS

This application is based on and claims priority to Korean Patent Application No. 10-2012-0073970, filed on Jul. 6, 2012, with the Korean Intellectual Property Office, the disclosure of which is incorporated by reference herein in its entirety.

BACKGROUND

1. Field of Invention

The present invention relates to a nonvolatile memory device and a method of manufacturing the nonvolatile memory device, and more particularly to a semiconductor memory device capable of recognizing threshold voltage distributions of memory cells and a method of operating the semiconductor memory device.

2. Description of the Related Art

An operation, e.g., an Error Correction Code (ECC), for correcting a fail bit, generable in a memory cell read operation of a NAND flash memory, needs departmentalizing a region in which an error is generated and performing a read operation on memory cells for each region.

When a controller performs the read operation on the memory cell in order to correct the fail bit, the controller performs a data output process on each necessary region. When the controller demands N regions, the controller is required to output data N times. That is, there occurs a problem in a timing due to the number of times of the data output in order to use a plurality of regions, and when the number of times the data output is reduced for use, there is a problem in failing to use a plurality of regions.

SUMMARY

The present invention has been made in an effort to provide a nonvolatile memory device and a method of manufacturing the nonvolatile memory device, which can reduce the number of times of data output demanded in a read operation process for recognizing distribution of memory cells by using an encoding value and use an infinite range in order to recognize the distribution of the memory cells without the addition of a latch.

An example embodiment of the present invention provides a method of operating a semiconductor memory device configured to divide a threshold voltage distribution of memory cells into first to eighth ranges by first to seventh read voltages, the method including: performing a read operation with a fourth read voltage for separating the first to eighth voltages into first to fourth ranges and fifth to eighth ranges; storing data "0" in a latch group coupled to memory cells having threshold voltages higher than the fourth read voltage and outputting the stored data as first encoding data; performing a read operation with a second read voltage for separating the first to fourth ranges into first and second ranges and third and fourth ranges and storing data "0" in a latch group coupled to memory cells having threshold voltages higher than the second read voltage; performing a read operation with a sixth read voltage for separating the fifth to eighth ranges into fifth and sixth ranges and seventh and eighth ranges and storing data "1" in a latch group coupled to memory cells having threshold voltages higher than the sixth read voltage; outputting the data stored in the latch groups as second encoding data; performing a read operation with a first read voltage for separating the first and second ranges into the first range and the second range and storing data "0" in a latch group coupled to memory cells having threshold voltages higher than the first read voltage; performing a read operation with a third read voltage for separating the third and fourth ranges into the third range and the fourth range and storing data "1" in a latch group coupled to memory cells having threshold voltages higher than the third read voltage; performing a read operation with a fifth read voltage for separating the fifth and sixth ranges into the fifth range and the sixth range and storing data "0" in a latch group coupled to memory cells having threshold voltages higher than the fifth read voltage; performing a read operation with a seventh read voltage for separating the seventh and eighth ranges into the seventh range and the eighth range and storing data "1" in a latch group coupled to memory cells having threshold voltages higher than the seventh read voltage; and outputting the data stored in the latch groups as third encoding data.

Another example embodiment of the present invention provides a method of operating a semiconductor memory device configured to divide a threshold voltage distribution of memory cells into $2^N$ ranges by $2^N-1$ (N≥2) read voltages, the method including: halving the $2^N$ ranges $2^N-1$ times, in which a read operation is performed with a corresponding read voltage among the $2^N-1$ read voltages whenever the halving is performed; storing data in a latch group coupled to the memory cells having threshold voltages higher than a corresponding read voltage after the performance of each read operation, in which data "0" and data "1" are sequentially and alternately stored for $2^k$ to $2^{k+1}-1$ (0≤k≤N-1) read operations; and outputting the data stored in the latch group after the performance of the $2^k$ to $2^{k+1}-1$ (0≤k≤N-1) read operations as $k+1^{th}$ encoding data.

Another example embodiment of the present invention provides a semiconductor memory device for dividing a threshold voltage distribution of memory cells into $2^N$ ranges by $2^N-1$ (N≥2) read voltages, the semiconductor memory device including: a memory array including a plurality of memory cells; an operation circuit group for performing a read operation on the memory cells by applying a corresponding read voltage among the $2^N-1$ read voltages to a word line, storing data in a latch group of memory cells having threshold voltages higher than the corresponding read voltage after the performance of the read operation, and outputting the data stored in the latch group as encoding data; and a control circuit for controlling the operation circuit group so as to repeatedly perform the read operations with the read voltages among the $2^N-1$ read voltages for sequentially halving the $2^N$ ranges, sequentially and alternately store data "0" and data "1" in the latch group of the memory cells having threshold voltages higher than the corresponding read voltage for $2^k$ to $2^{k+1}-1$ (0≤k≤N-1) read operations, and output the data stored in the latch group after the performance of the $2^k$ to $2^{k+1}-1$ (0≤k≤N-1) read operations as $k+1^{th}$ encoding data.

Another example embodiment of the present invention provides a semiconductor memory device for dividing a threshold voltage distribution of memory cells into $2^N$ ranges by $2^N-1$ (N≥2) read voltages, the semiconductor memory device including: a memory array including a plurality of memory cells; a voltage supply circuit configured to apply a corresponding read voltage among the $2^N-1$ read voltages to a word line coupled with the memory cells in order to perform a read operation; a page buffer including a latch group configured to store preset data for memory cells having threshold voltage higher than the corresponding read voltage as a result of the performance of the read operation, the page buffer being configured to output the data stored in the latch group as encoding data; and a control circuit for controlling the voltage supply circuit so as to repeatedly perform the read operations with the read voltages among the $2^N-1$ read voltages for sequentially halving the $2^N$ ranges, and controlling the page buffer so as to sequentially and alternately store data "0" and data "1" in a latch group of the memory cells having threshold voltages higher than the corresponding read voltage in performing $2^k$ to $2^{k+1}-1$ ($0 \leq k \leq N-1$) read operations and output the data stored in the latch group after the performance of the $2^k$ to $2^{k+1}-1$ ($0 \leq k \leq N-1$) read operations as $k+1^{th}$ encoding data.

According to the example embodiments of the present invention, an encoding value is set by sequentially defining ranges used for recognizing the distribution of memory cells based on a middle range and performing a read operation in an order from the middle range to an outermost range, so that infinite ranges may be used in order to recognize the distribution of the memory cells even without adding a circuit to an inside of the semiconductor memory device.

Accordingly, when the aforementioned method is used for correcting a fail bit, a controller may perform a read operation of a memory cell for detecting the fail bit on infinite error ranges without increase in a chip size.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a diagram illustrating a method of dividing threshold voltage distributions of memory cells into $2^3$ ranges according to a read voltage level and encoding the ranges in a case when N=3.

DETAILED DESCRIPTION

Figure 1:
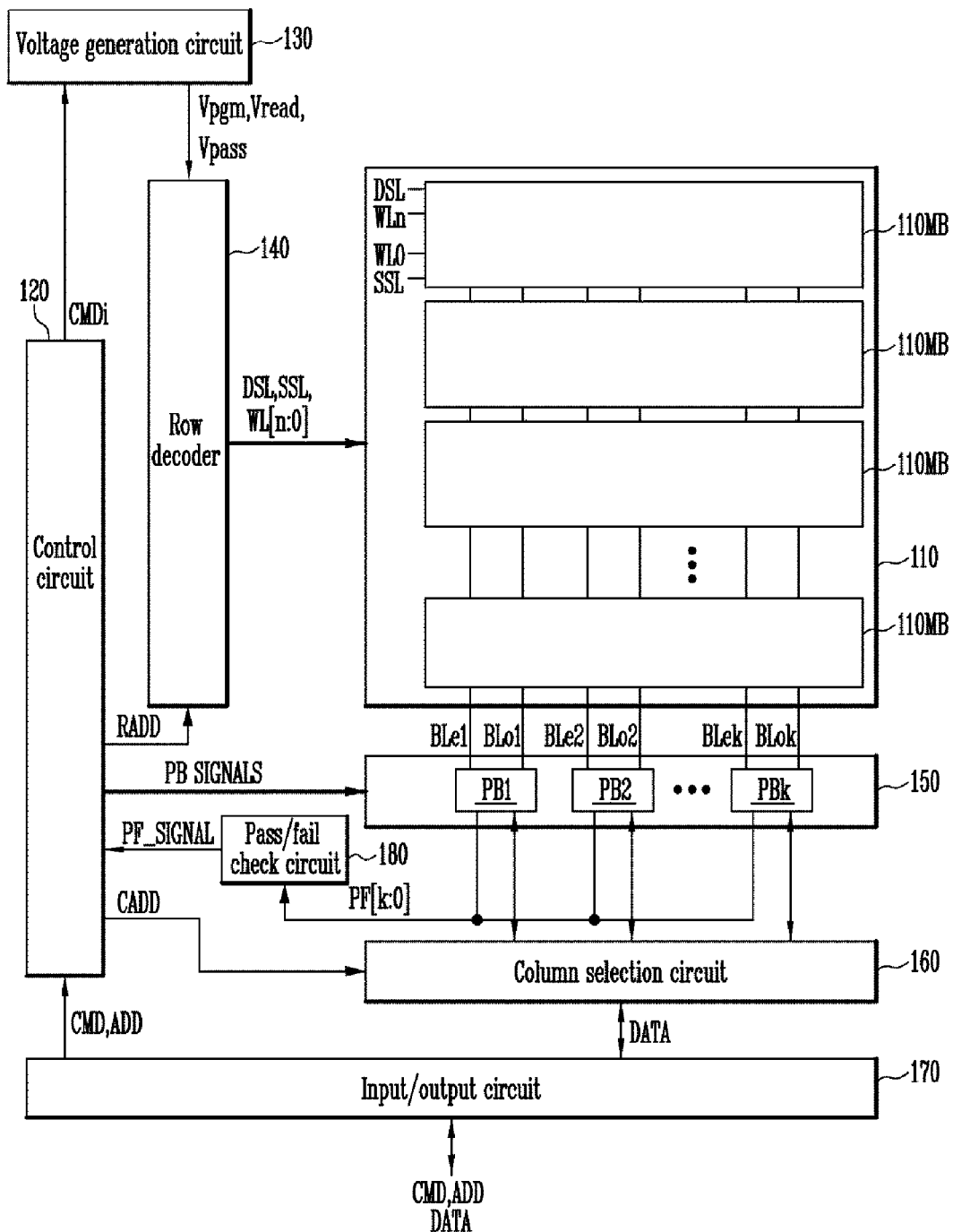
FIG. 1 is a block diagram illustrating a semiconductor memory device according to an example embodiment of the present invention.

Hereinafter, embodiments of the present invention will be described with reference to accompanying drawings so as to be understood by a person of ordinary skill in the art. However, the present invention can be variously implemented and is not limited to the following embodiments. Parts irrelevant to the description will be omitted to concisely describe the present invention. The same elements will be designated by the same reference numerals throughout the specification.

Throughout this specification and the claims that follow, when it is described that an element is "coupled" to another element, the element may be "directly coupled" to the other element or "electrically coupled" to the other element through a third element.

In addition, unless explicitly described to the contrary, the word "comprise" and variations, such as "comprises" or "comprising," will be understood to imply the inclusion of stated elements but not the exclusion of any other elements. Further, the terms, "a unit," "a device," and "a module," used herein mean a unit for processing at least one function or operation, and may be implemented by hardware or software or a combination of hardware and software.

Figure 2:
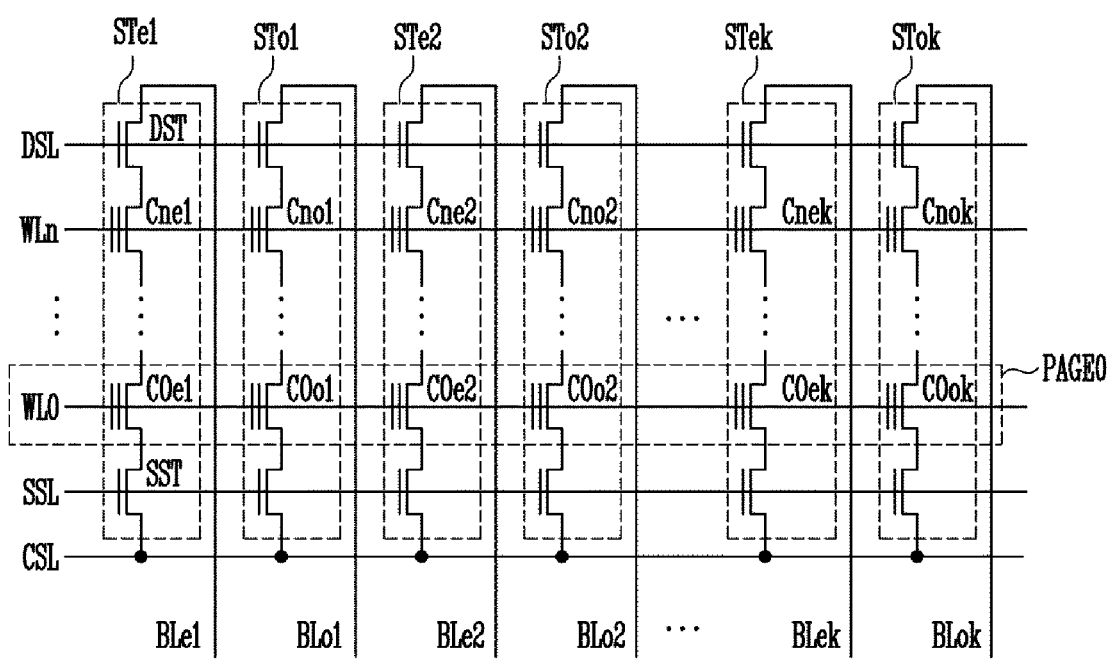
FIG. 2 is a circuit diagram illustrating a memory block illustrated in FIG. 1.

FIG. 1 is a block diagram illustrating a semiconductor memory device according to an example embodiment of the present invention, and FIG. 2 is a circuit diagram illustrating a memory block illustrated in FIG. 1.

The semiconductor memory device according to an example embodiment of the present invention includes a memory array 110 including a plurality of memory blocks 110MB, operation circuits 130, 140, 150, 160, 170, and 180 configured to perform a program operation, a read operation, and a test operation of memory cells included in a selected page of the memory cell blocks 110MB, and a control circuit 120 configured to control the operation circuits 130, 140, 150, 160, 170, and 180. The operation circuits may include voltage supply circuits 130 and 140, a page buffer group 150, a column selection circuit 160, an input/output circuit 170, and a pass/fail check circuit 180.

The memory array 110 includes the plurality of memory blocks 110MB. Referring to FIG. 2, each memory block includes a plurality of strings STe1 to STek and STo1 to STok coupled between bit lines BLe1 to BLek and BLo1 to BLok and a common source line CSL. That is, the strings STe1 to STok are coupled to corresponding bit lines BLe1 to BLok, respectively, and are commonly coupled to the common source line CSL. Each string STe1 includes a source select transistor SST in which a source is coupled to the common source line CSL, a plurality of memory cells C0e1 to Cne1, and a drain select transistor DST in which a drain is coupled to the bit line BLe1. The memory cells C0e1 to Cne1 are coupled between the select transistors SST and DST in series. A gate of the source select transistor SST is coupled to a source select line SSL, gates of the memory cells C0e1 to Cne1 are coupled to word lines SL0 to WLn, respectively, and a gate of the drain select transistor DST is coupled to the drain select line DSL.

The memory cells included in the memory cell block in the NAND flash memory device may be divided in a unit of a physical page or a logical page. For example, the memory cells C0e1 to C0ek and C0o1 to C0ok coupled to a single word line, e.g., a word line WL0, may be considered one physical page PAGE 0. Further, the even numbered memory cells C0e1 to C0ek coupled to the single word line, e.g., the word line WL0, may be considered one even physical page, and the odd numbered memory cells C0o1 to C0ok may be considered one odd physical page. The page (or the even page and the odd page) serves as a basic unit for a program operation or a read operation.

Referring to FIGS. 1 and 2 again, the control circuit 120 outputs an internal command signal CMDi for performing a program operation, a read operation, or a test operation in response to a command signal CMD input from outside the semiconductor memory device through the input/output circuit 170, and the control circuit 120 outputs PB control signals PB_SIGNALS according to a type of operation for controlling page buffers PB1 to PBk included in the page buffer group 150. Further, the control circuit 120 outputs a row address signal RADD and a column address signal CADD in response to an address signal ADD that is input from the outside through the input/output circuit 170.

The voltage supply circuits 130 and 140 supply operation voltages, e.g., Vpgm, Vread, and Vpass, necessary for the program operation, the read operation, and the test operation of the memory cells in response to the internal command signal CMDi to local lines including a drain select line DSL, word lines, WL0, . . . , and WLn, of the selected memory cell block. The voltage supply circuit includes a voltage generation circuit 130 and a row decoder 140.

The voltage generation circuit 130 outputs the operation voltages, e.g., Vpgm, Vread, and Vpass, necessary for the program operation, the read operation, and the test operation of the memory cells in response to the internal command signal CMDi to global lines. For example, for the program operation, the voltage generation circuit 130 outputs, to the global lines, the program voltage Vpgm for application to the memory cells of a selected page and the pass voltage Vpass for application to non-selected memory cells. For the read operation, the voltage generation circuit 130 outputs, to the global lines, the read voltage Vread for application to memory cells of the selected page and the pass voltage Vpass for application to the non-selected memory cells. In the test operation related to data storage, the voltage generation circuit 130 may output the program voltage Vpgm and the pass voltage Vpass like the program operation. In the test operation related to the data read, the voltage generation circuit 130 may output the read voltage Vread and the pass voltage Vpass like the read operation.

The row decoder 140 connects the global lines to the local lines DSL, WL0 to WLn, and SSL in response to row address signals RADD of the control circuit 120 such that operation voltages output to the global lines in the voltage generation circuit 130 may be transferred to the local lines DSL, WL0 to WLn, and SSL of the selected memory cell 110MB in the memory array 110. Accordingly, the program voltage Vpgm or the read voltage Vread is applied to the local word line, e.g. the word line WL0, coupled with the selected cell, e.g., the memory cell C0e1, from the voltage generation circuit 130 through the global word line. The pass voltage Vpass is applied from the voltage generation circuit 130 through the global word lines to the local word lines, e.g., the word lines WL1 to WLn, coupled with non-selected cells C1e1 to Cne1. In an erase operation, the erase voltage Vera may be applied to all the memory cells within a block. Accordingly, data is stored in the selected cell C0e1 by the program voltage Vpgm, and the data stored in the selected cell C0e1 is read by the read voltage Vread.

The page buffer groups 150 includes a plurality of page buffers PB1 to PBk coupled to the memory array 110 through the bit lines BLe1 to BLek and BLo1 to Blok, respectively. The page buffers PB1 to PBk of the page buffer group 150 selectively pre-charge the bit lines BLe1 to BLek or BLo1 to Blok according to input data in order to store the input data in the memory cells C0e1 to C0ek or C0o1 to C0ok in response to a PB control signal (PB_SIGNALS) of the control circuit 120, or sense voltages of the bit lines BLe1 to BLek or BLo1 to Blok in order to read the data from the memory cells C0e1 to C0ek or C0o1 to C0ok.

For example, when the program data, e.g., data "0", is input to the page buffer PB1 so as to be stored in the memory cell C0e1, the page buffer PB1 applies a program allowing voltage, e.g., the ground voltage, to the bit line BLe1 of the memory cell C0e1 in which the program data is stored during the program operation. As a result, a threshold voltage of the memory cell C0e1 is increased by the program voltage Vpgm applied to the word line WL0 and the program allowing voltage applied to the bit line BLe1 during the program operation. Further, when erase data, e.g., data "1" is input in the page buffer PB1 in order to store the erase data in the memory cell C0e1, the page buffer PB1 applies a program inhibition voltage, e.g., the power voltage, to the bit line BLe1 of the memory cell C0e1 in which the erase data is stored during the program operation. As a result, even though the program voltage Vpgm is applied to the word line WL0 in the program operation, the threshold voltage of the memory cell C0e1 is not increased by the program inhibition voltage applied to the bit line BLe1. As described above, according to the differentiation of the threshold voltage, different data may be stored in the memory cells.

In the read operation, the page buffer group 150 precharges all of the selected bit lines, e.g., BLe1 to BLek and discharges all of the non-selected bit lines, e.g., BLo1 to BLok among the even bit lines BLe1 to BLek and the odd bit lines BLo1 to BLok. Further, when the read voltage Vread is applied to a selected word line WL0 from the voltage supply circuits 130 and 140, the bit lines of the memory cells in which the program data is stored are maintained in a precharge state and the bit lines of the memory cells in which the erase data is stored are discharged. The page buffer group 150 senses a change in the voltages of the bit lines BLe1 to BLek, and latches data of the memory cells corresponding to a result of the sensing.

A detailed construction of the page buffer will be described later.

The column selection circuit 160 selects the page buffers PB1 to PBk included in the page buffer group 150 in response to a column address signal output from the control circuit 120. That is, the column selection circuit 160 sequentially transfers data to be stored in memory cells to the page buffers PB1 to PBk in response to the column address signal CADD. Further, the column selection circuit 160 sequentially selects the page buffers PB1 to PBk in response to the column address signal CADD such that the data of the memory cells latched in the page buffers PB1 to PBk through the read operation may be output outside the semiconductor device.

The input/output circuit 170 transfers the data to the column selection circuit 160 according to control of the control circuit 120 so as to input the data input from outside the semiconductor device in the page buffer group 150, in order to store the data in the memory cells in the program operation. When the column selection circuit 160 transfers the data transferred from the input/output circuit 170 to the page buffers PB1 to PBk of the page buffer group 150 according to the aforementioned method, the page buffers PB1 to PBk store the input data in an internal latch circuit. Further, the input/output circuit 170 outputs the data transferred from the page buffers PB1 to PBk of the page buffer group 150 through the column selection circuit 160 outside the semiconductor device in the read operation.

The pass/fail check circuit 180 outputs a pass/fail signal PF_SIGNAL in response to comparison results PF[1] to PF[k] associated with a memory cell, the comparison results PF[1] to PF[k] being output from the respective page buffers PB1 to PBk in a program verification operation performed after the program operation. Specifically, the threshold voltage of the memory cell is compared with a target voltage and a result value is latched in the internal latch circuit of the page buffers PB1 to PBk in the program verification operation. The latched comparison result signals PF1 to PF[k] are output to the pass/fail check circuit 180. The pass/fail check circuit 180 outputs the pass/fail signal PF_SIGNAL, indicating whether the program operation is completed, to the control circuit 120 in response to the comparison result signals PF1 to PF[k]. The control circuit 120 determines whether there exists a memory cell, among the memory cells in which the program data is stored, having a threshold voltage lower than the target voltage where the control circuit 120 may make this determination in response to the pass/fail signal PF_SIGNAL. The control circuit 120 may also determine whether to re-perform the program operation according to a result of the determination.

Figure 3:
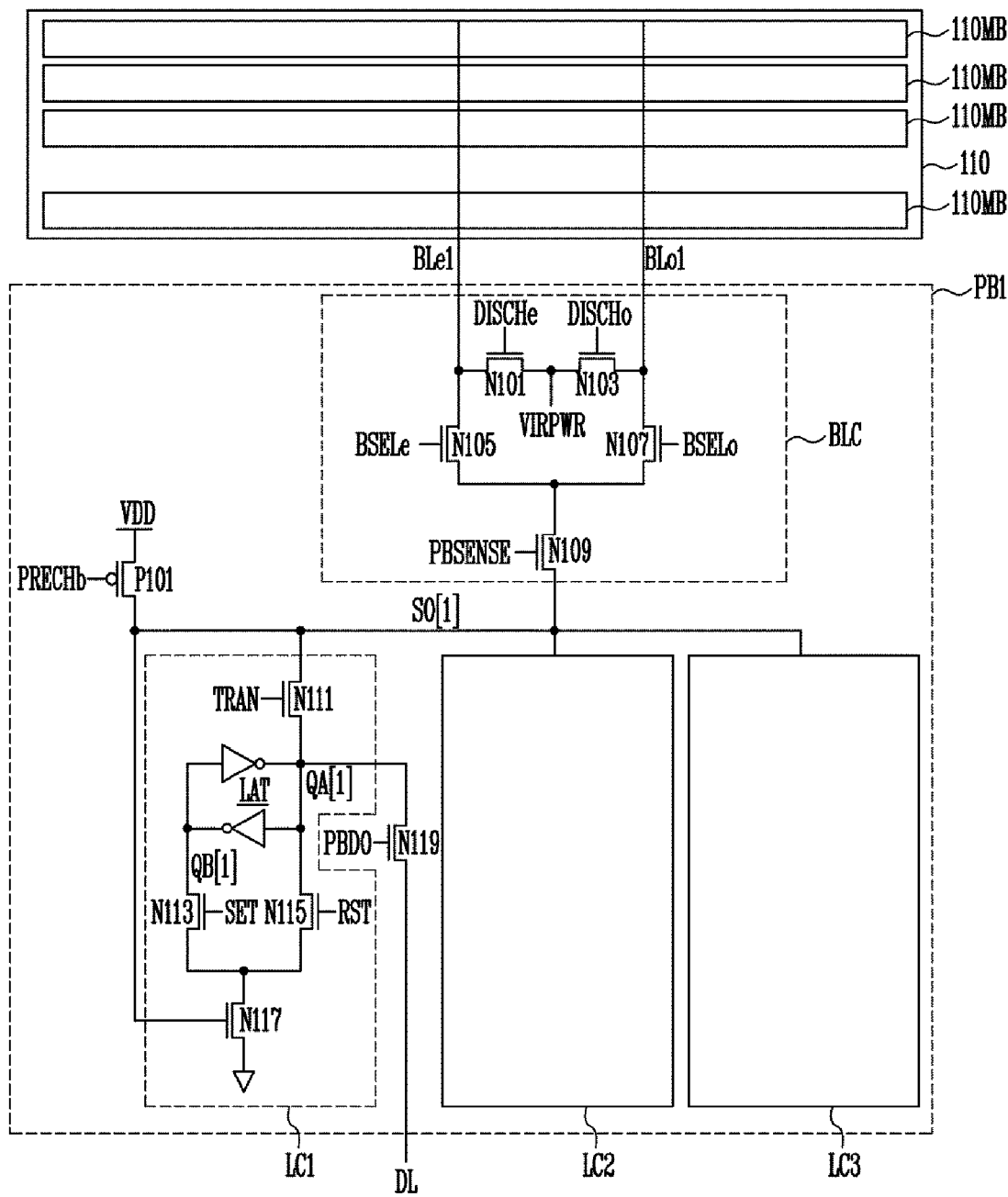
FIG. 3 is a circuit diagram illustrating a page buffer illustrated in FIG. 1.

FIG. 3 is a circuit diagram illustrating the page buffer illustrated in FIG. 1.

Referring to FIG. 3, the page buffer PB1 is operated under a control of the control circuit 120 of FIG. 1, and signals PRECHb, TRAN, RST, SET, PBSENSE, BLSe, BLSo, DISCHe, and DISCHo to be described below may be output by the control circuit.

The page buffer PB1 includes a bit line connection circuit BLC, a pre-charge circuit P101, and a plurality of latch circuits LC1 to LC3.

Switching elements N105 and N107 of the bit line connection circuit BLC select one bit line between the even bit line BLe1 and the odd bit line BLo1 in response to bit line selection signals BLSe and BLSo, the switching elements N101 and N103 performs an operation of pre-charging the non-selected bit line in the program operation and discharging the non-selected bit line in the read operation. The switching element N109 performs an operation of connecting the bit line selected by the switching elements N105 and N107 and one latch circuit from among the latch circuits LC1 to LC3 in response to a connection signal PBSENSE. The latch circuits LC1 to LC3 are coupled to the switching element N109 in parallel. A connection node of the switching element N109 and the latch circuits LC1 to LC3 is a sensing node SO.

The pre-charge circuit P101 performs an operation of pre-charging the sensing node SO in response to a pre-charge signal PRECHB.

The number of latch circuits LC1 to LC3 may be changed according to a design, and an embodiment including latch circuits LC1 to LC3 will be described as an example. One of the latch circuits LC1 to LC3 may be activated. Among them, the first latch circuit LC1 may temporarily store the data input from the column selection circuit 160 and transfer the data to the second latch circuit LC2. Or a latch circuit, for example first latch circuit LC1, may temporarily store data read from a memory cell through a read operation so as to output the data to the column selection circuit 160. The second latch circuit LC2 may apply the program inhibition voltage or the program allowing voltage to a bit line during the program operation according to data transferred from the first latch circuit LC1. Further, the second latch circuit LC2 may temporarily store data stored in a memory cell in response to voltage of the bit line and transfer the data to the first latch circuit LC1 in the read operation. The third latch circuit LC3 may latch a result value of a comparison between the threshold voltage and the target voltage of a memory cell and output a comparison result signal corresponding to the result value of the comparison to the pass/fail check circuit 180 of FIG. 1 as a result of a verification operation performed after the program operation.

The latch circuits LC1 to LC3 may include a plurality of switching elements and the latch. The first latch circuit LC1 will be described as an example.

The first latch circuit LC1 may include a latch LAT, and switching elements N111, N113, N115, N117, and N119. The latch LAT may be for latching the data. The switching element N111 may be configured to connect the first node QA of the latch LAT to the sensing node SO in response to a transmission signal TRAN. The switching elements N113 and N115 may be coupled to the first node QA and a second node QB of the latch LAT and may be operated in response to a set signal SET and a reset signal RST, respectively. The switching element N117 may be coupled between the switching elements N113 and N115 and a ground terminal and operated according to a potential of the sensing node SO. The switching element N119 may be configured to connect the first node QA of the latch LAT to a data line DL in response to a latch output signal PBDO.

Because signals having different waveforms are input to other latch circuits LC2 and LC3, even though the latch circuits LC1 to LC3 are configured with a substantially similar construction, only one latch circuit of the latch circuits LC1 to LC3 may be activated and each the latch circuits LC1 to LC3 may perform different functions.

Hereinafter, a method of defining ranges by dividing the threshold voltage distribution into a plurality of ranges and encoding and outputting the defined range in the semiconductor memory device having the aforementioned construction will be described.

Figure 4:
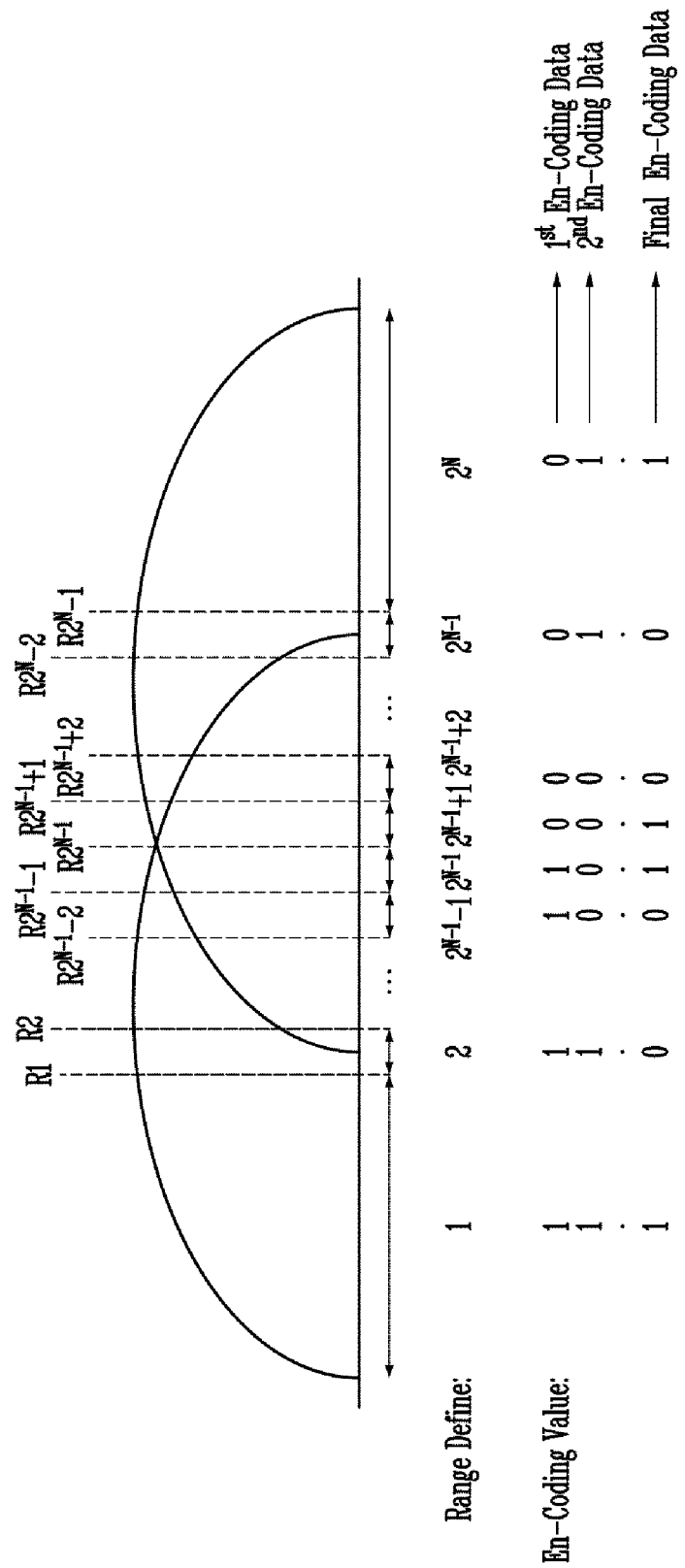
FIG. 4 is a graph illustrating a method of dividing threshold voltage distribution of memory cells into $2^N$ ranges according to a read voltage level and encoding the ranges.

FIG. 4 is a graph illustrating a method of dividing threshold voltage distributions of memory cells into $2^N$ ranges according to a read voltage level and encoding the ranges.

FIG. 4 illustrates voltage distribution ranges associated with the setting of an error range in order to correct an error bit as a result of a read operation of the semiconductor memory device as an example, but the embodiment of the present invention is not limited thereto. The threshold voltage distribution of the memory cells may be divided into a plurality of ranges and utilization of the result is not limited.

Referring to FIG. 4, when the threshold voltage distribution of the memory cells is set to $2^N$ ranges, where N (N≥1, N is integer) is a number used to attain the desired number of distribution ranges. If the desired number of ranges is 8, N may be set to 3. The respective ranges may be defined with numerical values from 1 to $2^N$, and boundary lines of read voltage levels by which the respective ranges are divided may be defined as voltages R1 to $R2^N-1$.

In response to a read operation for a memory cell in the semiconductor memory device according to an example embodiment of the present invention, when a threshold voltage of a corresponding memory cell increases to a specific read voltage level or higher, i.e., when the corresponding memory cell is programmed to have the specific read voltage or higher, data stored in the latch may be reset as "1" or "0". On the contrary, when a threshold voltage of a corresponding memory cell is equal to or lower than a specific read voltage level, i.e., when the corresponding memory cell is not programmed to have the specific read voltage or higher, the data stored in the latch is maintained without being reset. This will be described in more detail.

As illustrated in FIG. 3, when the bit line of a cell string including a selected memory cell from which data is to be read is first pre-charged to perform a read operation, read voltage (e.g., 0V) is applied to the word line coupled with the selected memory cell and pass voltage is applied to the word line coupled with the non-selected cells, i.e., for the remaining cells other than the selected memory cell, the voltage level of the bit line is maintained in the pre-charge state or is discharged according to the threshold voltage of the selected memory cell. When the threshold voltage of the selected memory cell is higher than the read voltage, the voltage level of the bit line is maintained in the pre-charge state, and thus the potential of the sensing node SO is maintained at a high level. Accordingly, the switching element N117 is turned on. In this case, when the set signal SET is input, the second node QB of the latch LAT is coupled with a ground so that the data "1" is set in the latch LAT, and when the reset signal RST is input, the first node QA of the latch LAT is coupled with the ground, the data "0" is set in the latch LAT. When the threshold voltage of the selected memory cell is lower than the read voltage, the bit line is discharged so that the potential of the sensing node SO is also discharged to a low level. Accordingly, the switching element N117 is not turned on and therefore initial data of the data stored in the latch LAT is maintained.

When the threshold voltage distribution of the memory cells is divided into $2^N$ ranges, an encoding value may be indicated through N times of output from the latch of the page buffer. Accordingly, the number of times that data is output may be remarkably reduced compared to the related art in which the range may be indicated only through the output $2^N$ times.

When the threshold voltage distribution of the memory cells is divided into $2^N$ ranges from a range 1 to a range $2^N$, the read operation for the output of first encoding data is performed based on a middle read voltage of the two divided distributions of the threshold voltages. That is, when it is assumed that the leftmost range among the $2^N$ ranges is the range 1 and the rightmost range is a range $2^N$, the read operation is performed based on a voltage $R2^N-1$ that is the read voltage for separating the $2^N$ ranges into ranges including $2^{N-1}$ ranges. When the threshold voltage of the memory cell is included in the ranges $2^{N-1}+1$ to $2^N$, i.e., when the threshold voltage of the memory cell is higher than the voltage $R2^N-1$, the data "0" is stored in the latch, and when the threshold voltage of the memory cell is included in the ranges 1 to $2^{N-1}$, i.e., when the threshold voltage of the memory cell is lower than the voltage $R2^N-1$, the existing data of the latch is maintained. Accordingly, the left/right range based on the voltage $R2^N-1$ may be used as a discriminator to determine a value of "1"/"0" (the existing data has been stored as "1"). For reference, the leftmost range, the range 1, and the rightmost range, the range $2^N$, may be defined by the control circuit (controller) of the semiconductor memory device.

The read operation for outputting second encoding data is performed after storing the data obtained through the read operation in the first latch of the page buffer and outputting the first encoding data (or storing the data in the second latch and then transmitting the data to the first latch).

Just as in the read operation outputting the first encoding data, the read operation for outputting the second encoding data is performed two times based on the read voltage for separating the rightmost to middle ranges, i.e. the ranges 1 to $2^{N-1}$, into ranges including the same number of ranges, and the read voltage for separating the rightmost to middle ranges, i.e., the ranges $2^N$ to $2^{N-1}$, into ranges including the same number or ranges. That is, the read operation for the output of the second encoding data is performed two times based on the two different read voltages. Just as in the read operation for outputting the first encoding data, in the first read operation in the read operations for outputting the second encoding data, when the threshold voltage of the memory cell is above a middle range of the ranges 1 to $2^{N-1}$ (that is, when the threshold voltage of the memory cell is higher than the read voltage for separating the ranges 1 to $2^N-1$ into ranges including the same number of ranges), the data "0" is stored in the second latch of the page buffer. When the threshold voltage of the memory cell is below the middle range of the ranges 1 to $2^{N-1}$ (that is, when the threshold voltage of the memory cell is lower than the read voltage for separating the ranges 1 to $2^{N-1}$ into ranges including the same number of ranges), the existing data is maintained. In the second read operation, when the threshold voltage of the memory cell is above the middle range of the ranges $2^{N-1}$ to $2^N$ (that is, when the threshold voltage of the memory cell is higher than the read voltage for having the ranges $2^{N-1}$ to $2^N$ into ranges including the same number of ranges), the data "1" is stored in the second latch of the page buffer. When the threshold voltage of the memory cell is below the middle range of the ranges $2^{N-1}$ to $2^N$ (that is, when the threshold voltage of the memory cell is lower than the read voltage for separating the ranges $2^{N-1}$ to $2^N$ into ranges including the same number of ranges), the existing data is maintained. That is, in the first read operation and the second read operation in the read operation for the output of the second encoding data, when the threshold voltage of the memory cell is higher than the reference read voltage, data of "0" or "1" is stored in the second latch, and the data stored in the first read operation is overwritten with the data stored in the second read operation.

After the output of the first encoding data which has been stored in the first latch is completed, the second encoding data stored in the second latch is transmitted to the first latch and outputted.

The same method is applied to third encoding data to $N^{th}$ encoding data so that the third encoding data to the $N^{th}$ encoding data are outputted.

Hereinafter, a flowchart of the encoding method will be described.

Figure 5:
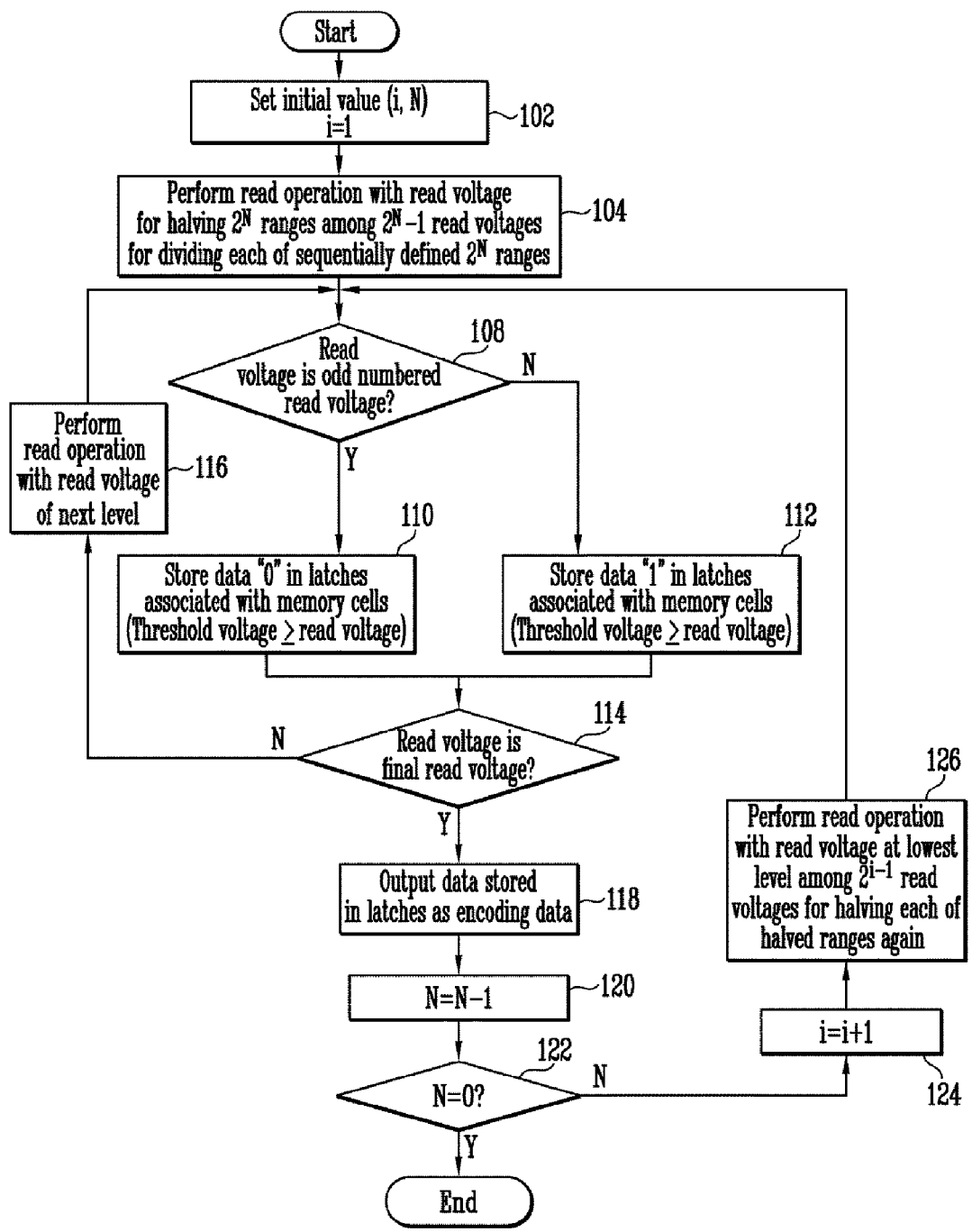
FIG. 5 is a flowchart illustrating a method of operating a semiconductor memory device according to an example embodiment of the present invention.

FIG. 5 is a flowchart illustrating a method of operating a semiconductor memory device according to an example embodiment of the present invention.

Referring to FIG. 5, first, initial values i and N are set. A value of i is set to 1 (step 102). When the threshold voltage distribution of the memory cells is divided into $2^N$ ranges from a range 1 to a range $2^N$, the read operation is performed based on a middle read voltage in the two threshold voltage distributions, i.e. the read voltage for separating the $2^N$ ranges into ranges including $2^{N-1}$ ranges, respectively (step 104).

It is determined whether the read voltage is an odd numbered read voltage (step 108). When the read voltage is the odd numbered voltage, data "0" is stored in latches associated with memory cells of which the threshold voltage is higher than the read voltage (step 110). When the read voltage is the even numbered read voltage, data "1" is stored in the latches associated with memory cells of which the threshold voltage is higher than the read voltage (step 112). It is determined whether a read voltage is a final read voltage (step 114). When the read voltage is the final read voltage, the data stored in the latches is output as encoding data (step 118). When the read voltage is not the final read voltage, the read operation is performed with a read voltage at a next level (step 116), and the process returns to step 108. Next, a value of N is decreased by 1 (step 120), and it is identified whether the value of N is "0" (step 122). When the value of N is not "0", a value of i is increased by 1 (step 124), and the read operation is performed with a read voltage at the lowest level among $2^{i-1}$ read voltages which halve the halved ranges again (step 126), and the process returns to step 108.

When the value of N becomes "0" in step 122, the operation is terminated. Accordingly, steps 108, 110, 112, 114, 116, 118, 120, 122, 124, and 126 are repeated until the value of N becomes "0."

As described above, in the method of operating the semiconductor memory device according to the example embodiment of the present invention, the read operation for the output of the first encoding data is performed once based on the one read voltage, the read operation for the output of the second encoding data is performed two times based on the two read voltages, and the read operation for the output of the third encoding data is performed four times based on the four read voltages. That is, when the threshold voltage distribution of the memory cells are divided into the N ranges, the output of the encoding data is performed N times and the number of read voltages used in the read operation for the output of each encoding data is increased twice, and when the threshold voltage of the memory cell is higher than a specific read voltage sequentially with respect to from the lowest read voltage to a higher read voltage in the read operations multiple times for the output of each encoding data, the data "0" and "1" is alternately stored in the latch.

In an embodiment, data may be stored in a latch circuit coupled to memory cells having a threshold voltage higher than a read voltage after the performance of each read operation, in which data "0" and data "1" is sequentially and alternately stored for $2^k$ to $2^{k+1}-1$ ($0 \leq k \leq N-1$) read operations, where k may be a whole number.

Further, the control circuit 120 (see FIG. 2) may be configured to control the operation circuits 130, 140, 150, 160, 170, and 180 to perform the disclosed methods and operations. Thus, the control circuit 120 may be configured to determine a range, among the $2^N$ ranges, in which a threshold voltage of each memory cell exists by combining at least the first to third encoding data.

Also, the control circuit 120 may be configured to control the operation circuits 130, 140, 150, 160, 170, and 180 such that that the data "1" is stored as initial data of the latch circuit included in the operation circuit group.

Further, the control circuit 120 may be configured to control the operation circuits 130, 140, 150, 160, 170, and 180, for example, the voltage supply circuits 130 and 140, to perform a read operation on the memory cells by applying a corresponding read voltage among the $2^N-1$ read voltages to the word line, storing data in a latch circuit of memory cells having threshold voltages higher than the corresponding read voltage after the performance of the read operation, and outputting the data stored in the latch circuit as encoding data.

The control circuit 120 may also control the operation circuits 130, 140, 150, 160, 170, and 180, for example, the page buffer group 150, such that data stored in the latch circuit is maintained when the threshold voltages of the memory cells are lower than corresponding read voltages after performing each read operation.

Further, the control circuit 120 may also control the operation circuits 130, 140, 150, 160, 170, and 180, for example, the voltage supply circuits 130 and 140, so as to repeatedly perform the read operations with the read voltages among the $2^N-1$ read voltages for sequentially halving the $2^N$ ranges, sequentially and alternately store data "0" and data "1" in the latch circuit of the memory cells having threshold voltages higher than the corresponding read voltage for $2^k$ to $2^{k+1}-1$ ($0 \leq k \leq N-1$) read operations, and output the data stored in the latch circuit after the performance of the $2^k$ to $2^{k+1}-1$ ($0 \leq k \leq N-1$) read operations as $k+1^{th}$ encoding data.

FIG. 6 is a diagram illustrating a division of the threshold voltage distribution of the memory cells into $2^3$ ranges according to a read voltage level and encoding the ranges in a case of N=3.

Referring to FIGS. 4 and 6, when N=3, the ranges in which the threshold voltages of all memory cells may be identified through the output of the encoding data three times according to the read voltage levels R1 to R7. For ease of description, when 8 ranges are divided into ranges A to H, it can be seen that when the encoding data of the memory cell is "111", the corresponding memory cell is included in the range A. When the encoding data of the memory cell is "110", the corresponding memory cell is included in the range B. When the encoding data of the memory cell is "100", the corresponding memory cell is included in the range C. When the encoding data of the memory cell is "101", the corresponding memory cell is included in the range D. When the encoding data of the memory cell is "001", the corresponding memory cell is included in the range E. When the encoding data of the memory cell is "000", the corresponding memory cell is included in the range F. When the encoding data of the memory cell is "010", the corresponding memory cell is included in the range G. When the encoding data of the memory cell is "011", the corresponding memory cell is included in the range H. Accordingly, a range including a large number of memory cells can be identified and a range including a small number of memory cells can be identified, so that the present invention may be used for detecting and correcting the fail bit by setting an error range.

First, in order to output the first encoding data, the read operation is performed based on the fourth read voltage R4 for separating the ranges A to H into the ranges A to D and the ranges E to H. When the threshold voltage of the memory cell is included in the ranges E to H, i.e., when the threshold voltage of the memory cell is higher than the fourth read voltage R4, the data "0" is stored in the first latch of the page buffer. Since the data "1" has been stored in the first latch as the initial data, when the threshold voltage of the memory cell is included in the ranges A to D, i.e., when the threshold voltage of the memory cell is lower than the fourth read voltage R4, the data "1" which have been stored in the first latch of the page buffer is maintained. As a result, the first encoding data "11110000" is set for the ranges A to H. As the embodiment, the first encoding data is stored in the second latch of the page buffer and the transmitted to the first latch to be outputted.

When the first encoding data is output for the entire memory cells, the read operation for the output of the second encoding data is performed two times. First, the read operation is performed based on the second voltage R2 for separating the ranges A to D into the ranges A to B and the ranges C to D. When the threshold voltage of the memory cell is included in the ranges C to H, the data "0" is stored in the second latch of the page buffer. When the threshold voltage of the memory cell is included in the ranges A to B, the existing data "1" is maintained. Accordingly, the encoding data "11000000" is set. Next, the read operation is performed based on a sixth read voltage R6 for separating the ranges E to H into the ranges E to F and the ranges G to H. When the threshold voltage of the memory cell is included in the ranges G to H, the data "1" is stored in the second latch of the page buffer. That is, the previously stored data "0" in the read operation based on the second read voltage R2 is changed to the data "1" through the read operation based on the sixth read voltage R6. When the threshold voltage of the memory cell is included in the ranges A to F, the existing data is maintained. As a result, the second encoding data "11000011" is set for the ranges A to H. The second encoding data stored in the second latch is transmitted to the first latch to be outputted.

Finally, the read operation for the output of the third encoding data is performed four times. First, the read operation is performed based on the first read voltage R1 for separating the ranges A to B into the range A and the range B. When the threshold voltage of the memory cell is included in the ranges B to H, the data "0" is stored in the second latch of the page buffer. When the threshold voltage of the memory cell is included in the range A, the existing "1" is maintained. Accordingly, the encoding data "10000000" is set. Next, the read operation is performed based on the third read voltage R3 for separating the ranges C to D into the range C and the range D. When the threshold voltage of the memory cell is included in the ranges D to H, the data "1" is stored in the second latch of the page buffer. That is, the previously stored data "0" in the read operation based on the first read voltage R1 is changed to the data "1" through the read operation based on the third read voltage R3. When the threshold voltage of the memory cell is included in the ranges A to C, the existing data is maintained. Accordingly, the encoding data "10011111" is set. Next, the read operation is performed based on the fifth read voltage R5 for separating the ranges E to F into the range E and the range F. When the threshold voltage of the memory cell is included in the ranges F to H, the data "0" is stored in the second latch of the page buffer. That is, the previously stored data "1" in the read operation based on the third read voltage R3 is changed to the data "0" through the read operation based on the fifth read voltage R5. When the threshold voltage of the memory cell is included in the ranges A to E, the existing data is maintained. Accordingly, the encoding data "10011000" is set. Finally, the read operation is performed based on the seventh read voltage R7 for separating the ranges G to H into the range G and the range H. When the threshold voltage of the memory cell is included in the range H, the data "1" is stored in the second latch of the page buffer. That is, the previously stored data "0" in the read operation based on the fifth read voltage R5 is changed to the data "1" through the read operation based on the seventh read voltage R7. When the threshold voltage of the memory cell is included in the ranges A to G, the existing data is maintained. Accordingly, the third encoding data "10011001" is set for the ranges A to H. The third encoding data stored in the second latch is transmitted to the first latch and outputted.

The eight ranges may have the unique code division values through the output of the encoding data three times and it can be seen that a specific range and the number of respective memory cells included in the specific range through the code division value, so that the operation for correcting the fail bit may progress. A range in which a threshold voltage of a memory cell exists may be determined by combining at least the first to third encoding data.

As described above, according to the example embodiment of the present invention, the threshold voltage distribution of the memory cells are divided into a plurality of ranges, in which the range is divided by performing the read operation with the read voltage level corresponding to the middle range of a previous range, i.e. the read voltage level for separating the previous range into two ranges having the same size.

Further, in performing the read operations multiple times for the output of each encoding data, the data "0" and "1" is alternately stored in the latches corresponding to the over programmed memory cells according to the read voltage moving from the lowest read voltage level to a higher read voltage level, so that it is possible to divide the $2^N$ ranges only with the output of the encoding data N times by using only two latches regardless of a size of N.

Accordingly, in performing the data output by converting each range into an encoding value in order to reduce the number of times of the data output, it is not necessary to add a latch circuit corresponding to each range to the inside of the device.

The aforementioned example embodiment of the present invention is not implemented only through the device and the method, but may be implemented through a program for executing a function corresponding to the configuration of an example embodiment of the present invention or a recording medium recording the program. Further, those skilled in the technical field to which the present invention belongs will easily implement such an implementation from the description of the aforementioned example embodiment.

From the foregoing, it will be appreciated that various embodiments of the present invention have been described herein for purposes of illustration, and that various modifications may be made without departing from the scope and spirit of the present invention. Accordingly, the various embodiments disclosed herein are not intended to be limiting, with the true scope and spirit being indicated by the following claims.

What is claimed is:

1. A method of operating a semiconductor memory device configured to divide a threshold voltage distribution of memory cells into first to eighth ranges by first to seventh read voltages, the method comprising:
   performing a read operation with a fourth read voltage for separating the first to eighth voltages into first to fourth ranges and fifth to eighth ranges;
   storing data "0" in a latch group coupled to memory cells having threshold voltages higher than the fourth read voltage and outputting the stored data as first encoding data;
   performing a read operation with a second read voltage for separating the first to fourth ranges into first and second ranges and third and fourth ranges and storing data "0" in a latch group coupled to memory cells having threshold voltages higher than the second read voltage;
   performing a read operation with a sixth read voltage for separating the fifth to eighth ranges into fifth and sixth ranges and seventh and eighth ranges and storing data "1" in a latch group coupled to memory cells having threshold voltages higher than the sixth read voltage;
   outputting the data stored in the latch groups as second encoding data;
   performing a read operation with a first read voltage for separating the first and second ranges into the first range and the second range and storing data "0" in a latch group coupled to memory cells having threshold voltages higher than the first read voltage;
   performing a read operation with a third read voltage for separating the third and fourth ranges into the third range and the fourth range and storing data "1" in a latch group coupled to memory cells having threshold voltages higher than the third read voltage;
   performing a read operation with a fifth read voltage for separating the fifth and sixth ranges into the fifth range and the sixth range and storing data "0" in a latch group coupled to memory cells having threshold voltages higher than the fifth read voltage;
   performing a read operation with a seventh read voltage for separating the seventh and eighth ranges into the seventh range and the eighth range and storing data "1" in a latch group coupled to memory cells having threshold voltages higher than the seventh read voltage; and
   outputting the data stored in the latch groups as third encoding data.

2. The method of claim 1, further comprising determining a range, in which the threshold voltage of the memory cell exists, among the first to eighth ranges by combining the first to third encoding data.

3. The method of claim 1, wherein the latch group stores the data "1" as initial data.

4. The method of claim 3, wherein when the threshold voltage of the memory cell is lower than a corresponding read voltage after performing each read operation, the data stored in the latch group is maintained.

5. The method of claim 1, wherein the latch group comprises a first latch and a second latch, and the first to third encoding data is stored in the second latch, transmitted to the first latch, and then outputted.

6. A method of operating a semiconductor memory device configured to divide a threshold voltage distribution of memory cells into $2^N$ ranges by $2^N-1$ ($N\geq 2$) read voltages, the method comprising:

halving the $2^N$ ranges $2^N-1$ times, in which a read operation is performed with a corresponding read voltage among the $2^N-1$ read voltages whenever the halving is performed;

storing data in a latch group coupled to the memory cells having threshold voltages higher than a corresponding read voltage after the performance of each read operation, in which data "0" and data "1" are sequentially and alternately stored for $2^k$ to $2^{k+1}-1$ ($0\leq k\leq N-1$) read operations; and outputting the data stored in the latch group after the performance of the $2^k$ to $2^{k+1}-1$ ($0\leq k\leq N-1$) read operations as $k+1^{th}$ encoding data.

7. The method of claim 6, further comprising determining a range, in which a threshold voltage of each memory cell exists, among the $2^N$ ranges by combining the encoding data.

8. The method of claim 6, wherein the latch group stores the data "1" as initial data.

9. The method of claim 8, wherein when the threshold voltages of the memory cells are lower than corresponding read voltages after performing each read operation, the data stored in the latch group is maintained.

10. The method of claim 6, wherein the latch group comprises a first latch and a second latch, and the encoding data is stored in the second latch, transmitted to the first latch, and then outputted.

11. A semiconductor memory device for dividing a threshold voltage distribution of memory cells into $2^N$ ranges by $2^N-1$ ($N\geq 2$) read voltages, the semiconductor memory device comprising:

a memory array including a plurality of memory cells;

an operation circuit group for performing a read operation on the memory cells by applying a corresponding read voltage among the $2^N-1$ read voltages to a word line, storing data in a latch group of memory cells having threshold voltages higher than the corresponding read voltage after the performance of the read operation, and outputting the data stored in the latch group as encoding data; and a control circuit for controlling the operation circuit group so as to repeatedly perform the read operations with the read voltages among the $2^N-1$ read voltages for sequentially halving the $2^N$ ranges, sequentially and alternately store data "0" and data "1" in the latch group of the memory cells having threshold voltages higher than the corresponding read voltage for $2^k$ to $2^{k+1}-1$ ($0\leq k\leq N-1$) read operations, and output the data stored in the latch group after the performance of the $2^k$ to $2^{k+1}-1$ ($0\leq k\leq N-1$) read operations as $k+1^{th}$ encoding data.

12. The semiconductor memory device of claim 11, wherein the control circuit determines a range, in which a threshold voltage of each memory cell exists, among the $2^N$ ranges by combining the encoding data.

13. The semiconductor memory device of claim 11, wherein the control circuit controls the operation circuit group such that the data "1" is stored as initial data of the latch group included in the operation circuit group.

14. The semiconductor memory device of claim 13, wherein the control circuit controls the operation circuit group such that the data stored in the latch group is maintained when the threshold voltages of the memory cells are lower than corresponding read voltages after performing each read operation.

15. The semiconductor memory device of claim 11, wherein the operation circuit group comprises a first latch and a second latch, and the control circuit controls the operation circuit group such that the encoding data is stored in the second latch, transmitted to the first latch, and then outputted.

16. A semiconductor memory device for dividing a threshold voltage distribution of memory cells into $2^N$ ranges by $2^N-1$ ($N\geq 2$) read voltages, the semiconductor memory device comprising:

a memory array including a plurality of memory cells;

a voltage supply circuit configured to apply a corresponding read voltage among the $2^N-1$ read voltages to a word line coupled with the memory cells in order to perform a read operation;

a page buffer comprising a latch group configured to store preset data for memory cells having threshold voltage higher than the corresponding read voltage as a result of the performance of the read operation, the page buffer being configured to output the data stored in the latch group as encoding data; and a control circuit for controlling the voltage supply circuit so as to repeatedly perform the read operations with the read voltages among the $2^N-1$ read voltages for sequentially halving the $2^N$ ranges, and controlling the page buffer so as to sequentially and alternately store data "0" and data "1" in a latch group of the memory cells having threshold voltages higher than the corresponding read voltage in performing $2^k$ to $2^{k+1}-1$ ($0\leq k\leq N-1$) read operations and output the data stored in the latch group after the performance of the $2^k$ to $2^{k+1}-1$ ($0\leq k\leq N-1$) read operations as $k+1^{th}$ encoding data.

17. The semiconductor memory device of claim 16, wherein the control circuit determines a range, in which each memory cell exist, among the $2^N$ ranges by combining the encoding data.

18. The semiconductor memory device of claim 16, wherein the control circuit controls the operation circuit group such that the data "1" is stored as initial data of the latch group included in the page buffer.

19. The semiconductor memory device of claim 18, wherein the control circuit controls the page buffer such that the data stored in the latch group is maintained when the threshold voltages of the memory cells are lower than corresponding read voltages after performing each read operation.

20. The semiconductor memory device of claim 16, wherein the page buffer comprises a first latch and a second latch, and the control circuit controls the page buffer such that the encoding data is stored in the second latch, transmitted to the first latch, and then outputted.

* * * * *